United States Patent
Osada et al.

(10) Patent No.: US 6,560,141 B2
(45) Date of Patent: May 6, 2003

(54) SEMICONDUCTOR INTEGRATED CIRCUIT WITH MEMORY REDUNDANCY CIRCUIT

(75) Inventors: Kenichi Osada, Kawasaki (JP); Koichiro Ishibashi, Warabi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/925,412

(22) Filed: Aug. 10, 2001

(65) Prior Publication Data

US 2002/0075721 A1 Jun. 20, 2002

(30) Foreign Application Priority Data

Dec. 14, 2000 (JP) ........................................ 2000-384901

(51) Int. Cl.[7] .............................................. G11C 11/00
(52) U.S. Cl. ........................................ 365/154; 365/201
(58) Field of Search ................................ 365/154, 201, 365/203, 189.06; 257/189; 714/733

(56) References Cited

U.S. PATENT DOCUMENTS

| | | | | |
|---|---|---|---|---|
| 4,903,238 A | * | 2/1990 | Miyatake et al. ...... | 365/189.06 |
| 5,841,716 A | * | 11/1998 | Iwaki ........................ | 365/203 |
| 5,999,466 A | * | 12/1999 | Marr et al. ................ | 365/201 |
| 6,081,465 A | * | 6/2000 | Wang et al. ............... | 365/201 |
| 6,160,746 A | * | 12/2000 | Park et al. ................. | 365/203 |
| 6,185,141 B1 | * | 2/2001 | Hoshita et al. ............ | 365/203 |
| 6,249,468 B1 | * | 6/2001 | Kan et al. .................. | 365/201 |
| 6,367,042 B1 | * | 4/2002 | Phan et al. ................ | 714/733 |

OTHER PUBLICATIONS

U.S. patent application publication US 2002/0024059 by Hidaka US.*

* cited by examiner

Primary Examiner—David Nelms
Assistant Examiner—Thinh T. Nguyen
(74) Attorney, Agent, or Firm—Antonelli, Terry, Stout & Kraus, LLP (57) ABSTRACT

A control signal for a P-channel type MOS transistor that precharges a bit line and a complementary bit line is separated from a control signal for a P-channel type MOS transistor that equalizes the bit line and the complementary bit line. In failure analysis, the bit line and the complementary bit line are respectively supplied with separate voltages, and an offset voltage of a sense amplifier and a read current in a memory cell are measured to thereby perform failure analysis and to start up the manufactured article.

14 Claims, 6 Drawing Sheets

SEMICONDUCTOR INTEGRATED CIRCUIT WITH MEMORY REDUNDANCY CIRCUIT

BACKGROUND OF THE INVENTION

The present invention relates to semiconductor integrated circuits, and methods of designing and making the circuits. More particularly, the present invention relates to failure analysis of an on-chip memory provided in a large-scale integrated system or an on-chip memory and a SRAM (Static Random Access Memory) produced in a new process.

Failure analysis of a cache memory provided in a large-scale integrated system and an on-chip memory produced in a new process at the beginning of its manufacture is complicated and requires much time and hence hinders an early start-up of the manufactured article. Such failure analysis is made by changing an activation timing of a sense amplifier and acquiring a fail bit map, but it is difficult to specify the causes of the failures and to start up the article early. Recently, it has been tried to directly measure the memory cell's current and irregular AC characteristics of sense amplifier offset voltages within the chip to thereby start up the article early. This method, however, requires designing and making a TEG (Test Element Group) by way of trial, which increases the cost.

A well-known technique to solve this problem is disclosed in U.S. Pat. No. 6,081,465 issued to Wang et al. This reference discloses a circuit for controlling a potential of a bit line with a new switch externally to directly measure an AC characteristic, for example, of a memory cell current in the manufactured article itself to thereby facilitate its failure analysis.

In this prior art, however, it is necessary to add the switch newly to the bit line, which invites increases in the memory area and access time for the memory. The access to the memory is possible only in units of a column, and a signal to select a column is needed, which further increases the memory area.

SUMMARY OF THE INVENTION

According to one aspect of the present invention, there is provided a semiconductor integrated circuit comprising: a plurality of memory cells (CELL); a pair of bit line (CBL0) and complementary bit line (BB0) connected to the plurality of memory cells; a precharging P-channel type MOS transistor (MP5) for connecting the bit line (BL0) to a first power voltage line (VDD); a second precharging P-channel type MOS transistor (MP6) for connecting the complementary bit line (BB0) to a second power voltage line (VDD1); an equalizing P-channel type MOS transistor (MP7) for connecting the bit line (BL0) and the complementary bit line (BB0); a P-channel type MOS transistor (MP11) for connecting the bit line (BL0) to a sense amplifier circuit (107); and a P-channel type MOS transistor (MP12) for connecting the complementary bit line (BB0) to a sense amplifier circuit (107), wherein control signals for the precharging P-channel type MOS transistors (MP5 and MP6) are separated from a control signal for the equalizing P-channel type MOS transistor (MP7) so that the bit lines (BL0, BB0) are supplied with corresponding separate voltages.

The first and second power voltages (VDD) and (VDD1) lines are at the same voltage level in a normal operating period. Those power voltage lines are connected to different voltage levels in the failure analysis, and independent voltage levels are applied to the bit line (BL0) and the complementary bit line (BB0) to thereby measure an offset voltage of the sense amplifier and a read current flowing in the memory cell.

DESCRIPTION OF THE EMBODIMENTS

Semiconductor storage devices according to embodiments of the present invention will be described next with reference to the accompanying drawings.

(Embodiment 1)

Figure 1:
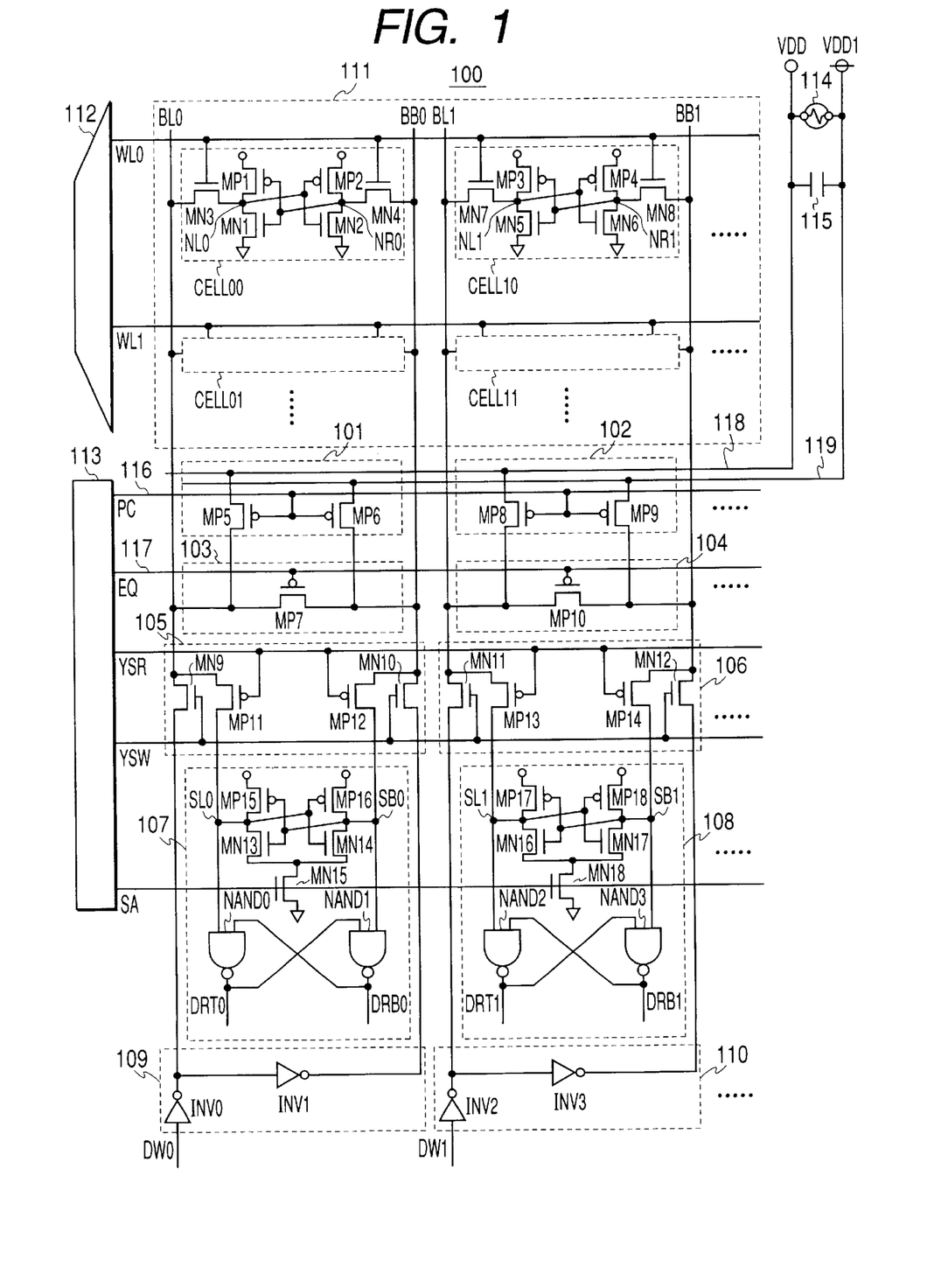
FIG. 1 is a schematic of a semiconductor integrated circuit according to an embodiment 1.

FIG. 1 is a schematic of an embodiment 1 of the semiconductor device according to the present invention. The semiconductor device comprises a cache memory 100 provided in a semiconductor substrate, for example, of single crystal silicon, using a semiconductor integrated circuit manufacturing technique. A plurality of memory cells CELL00, CELL0, CELL10, CELL11, . . . are arranged in the form of a matrix to compose a memory array 111.

The memory CELL00 is composed of a flip-flop that comprises a pair of CMOS inverters wherein the input and output of one CMOS inverter are respectively connected to the output and input of the other CMOS inverter (P-channel type MOS transistors MP1 and MP2, and N-channel type transistors MN1 and MN2) and N-channel type MOS transistors MN3 and MN4 that selectively connect storage nodes NL0 and NR0 of the flip-flop to bit lines BL0 and BB0, respectively. A word line WL0 is connected to the gate electrodes of the N-channel type MOS transistors MN3 and MN4.

The memory CELL10 is composed of a flip-flop that comprises a pair of CMOS inverters wherein the input and output of one of one CMOS inverter are respectively connected to the output and input of the other CMOS inverter (P-channel type MOS transistors MP3 and MP4, and N-channel type transistors MN5 and MN6) and N-channel type MOS transistors MN7 and MN8 that selectively connect storage nodes NL1 and NR1 of the flip-flop to bit lines BL1 and BB1, respectively. A word line WL0 is connected to the gate electrodes of the N-channel type MOS transistors MN7 and MN8.

Sense amplifier circuits 107, 108, . . . ; write amplifier circuits 109, 110, . . . ; precharge circuits 101, 102, . . . ; equalizer circuits 103, 104, . . . ; and Y-switch circuits 105, 106, . . . are arranged in corresponding columns.

For convenience of explanation, only the two detailedly illustrated columns of the cache memory 100 will be described below.

The sense amplifier circuit 107 comprises a flip-flop that includes a pair of P-channel type MOS transistors MP15 and MP16, and a pair of N-channel type MOS transistors MN13 and MN14; a latch type sense amplifier circuit that comprises an N-channel type MOS transistor MN15 to activate the sense amplifier circuit; and a pair of NAND gates NAND0 and NAND1. Drain electrodes of the P- and N-channel type MOS transistors MP15 and MN13 are connected to a sense data line SL0. Drain electrodes of the P- and N-channel type MOS transistors MP16 and MN14 are connected to a sense data line SB0.

The sense amplifier circuit 108 comprises a flip-flop that includes a pair of P-channel type MOS transistors MP17 and MP18, and a pair of N-channel type MOS transistors MN16 and MN17; a latch type sense amplifier circuit that comprises an N-channel type MOS transistor MN18 to activate the sense amplifier circuit; and a pair of NAND gates NAND2 and NAND3. The drain electrodes of the P- and N-channel type MOS transistors MP17 and MN16 are connected to a sense data line SL1. The drain electrodes of the P- and N-channel type MOS transistors MP18 and MN17 are connected to a sense data line SB1.

The Y-switch circuit 105 comprises a pair of P-channel type MOS transistors MP11 and MP12 that connect the bit lines BL0 and BB0 and the sense amplifier circuit 107, a pair of N-channel type MOS transistor MN9 and MN10 that connect the bit lines BL0 and BB0, respectively, and the write amplifier 109. A control signal YSR controls the P-channel type MOS transistors MP11 and MP12; and a control signal YSW controls the N-channel type MOS transistors MN9 and MN10.

The Y-switch circuit 106 comprises a pair of P-channel type MOS transistors MP13 and MP14 that connect the bit lines BL1 and BB1, respectively, and the sense amplifier circuit 108, a pair of N-channel type MOS transistor MN11 and MN12 that connect the bit lines BL1 and BB1, respectively, and the write amplifier 110. A control signal YSR controls the P-channel type MOS transistors MP13 and MP14; and a control signal YSW controls the N-channel type MOS transistors MN11 and MN12.

The write amplifier circuit 109 comprises a pair of inverters INV0 and INV1.

The write amplifier circuit 110 comprises a pair of inverters INV2 and INV3.

The precharge circuit 101 comprises a pair of P-channel type MOS transistors MP5 and MP6 that connect the first and second power voltages VDD and VDD1 and bit lines BL0 and BB0, respectively. A control signal PC is applied to the gate electrodes of the pair of P-channel type MOS transistors MP5 and MP6.

The precharge circuit 102 comprises a pair of P-channel type MOS transistors MP8 and MP9 that connect the first and second power voltages VDD, VDD 1 and bit lines BL1 and BB1, respectively. A control signal PC is applied to the gate electrodes of the pair of P-channel type MOS transistors MP8 and MP9.

The equalizer 103 comprises a P-channel type MOS transistor MP7 that connects the bit lines BL0 and BB0 to each other with a control signal EQ being applied to the gate electrodes of the P-channel type MOS transistors MP7.

The equalizer 104 comprises a P-channel type MOS transistor MP10 that connects the bit lines BL1 and BB1 to each other with a control signal EQ being applied to the gate electrodes of the P-channel type MOS transistors MP10.

A line 116 connected to the gates of the P-channel type MOS transistors MP5, MP6, MP8, MP9, . . . for precharging purposes can be separated from a line 117 connected to the gates of the P-channel type MOS transistors MP7 and MP10 for equalizing purposes to control precharging and equalizing operations separately. Lines 118 and 119 connected to the sources of the P-channel MOS transistors MP5, MP6, MP8 and MP9 for precharging purposes are separated from each other to apply separate voltages to the pair of bit lines BL and BB.

A control circuit 113 that controls control signals SA, YSW, YSR, EQ and PC and a word driver/decoder circuit 112 that decodes a pair of word lines WL0 and WL1 are provided.

The second power voltage VDD1 is supplied directly from a dedicated IO pad. This voltage is usually connected to the first power voltage VDD by way of a top metal layer or fuse 114, a PMOS switch, a package's bonding wire to the first power voltage VDD. A capacitor having a large capacity 15 is connected between the first and second power voltages.

When a new process is used or the on-chip memory becomes defective due to extension of a variety of products, the second power voltage VDD1 is separated from the first power voltage. When the top metal layer connects the first and second power voltages, it should be re-shaped, using a different mask or it should be cut by a FIB (Focused Ion Beam) to separate the second power voltage from the first power voltage. If the first and second power voltages are connected by a fuse, they should be separated from each other by cutting the fuse. When they are connected by a P-channel type MOS transistor, they are separated by connecting the gate electrode of the MOS transistor to the first power voltage VDD. When they are connected within the package, and the integrated circuit is measured at its wafer level, there is no problem because they are already separated.

Figure 2:
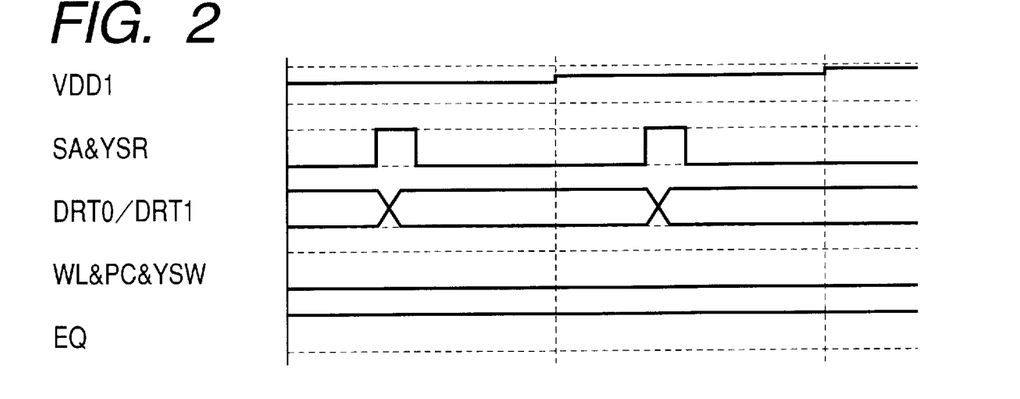
FIG. 2 illustrates an operating waveform used to measure a sense amplifier offset voltage of the semiconductor integrated circuit according to the embodiment 1.

Measurement of offset voltages of the pair of sense amplifier circuits 107 and 108 of the cache memory will be described next. FIG. 2 illustrates the operating waveform of each of the sense amplifier circuits. All the word lines WL are placed at "L" (low level) and rendered non-selected. The control signals YSW and EQ are set at "L" and "H" (high level) to turn off the N- channel type MOS transistors MN9, MN10, MN11 and MN12 and the P-channel type MOS transistors MP7 and MP10. The control signal PC is set at "L" to turn on the P-channel type MOS transistors MP5, MP6, MP8 and MP9.

The control signals SA and YSR are then set at "L" to thereby provide the second power voltage VDD1, for example, with a voltage that is 50 mV lower than the first power voltage VDD. At this time, a voltage of 50 mV is inputted across the input nodes SL0 and SB0 of the sense amplifier circuit 107. Similarly, a voltage of 50 mV is inputted across the input nodes SL1 and SB1 of the sense amplifier circuit 108.

Then, the control signals SA and YSR are changed to "H" to separate the input nodes SL0, SB0, SL1 and SB1 of the sense amplifier circuits from the bit lines BL0, BB0, BL1 and BB1. Simultaneously, the sense amplifier circuits 107 and 108 are activated to check the outputs DRT0 and DRT1. If the sense amplifier circuits have no offset voltages, they perform proper amplification and their outputs DRT0 and DRT1 become "L". If the offset voltages of the sense amplifier circuits are not less than 50 mV, their outputs become "H".

Then, the second power voltage VDD1 is set at a level which is, for example, 45 mV lower than the first power voltage VDD and the control signals SA and YSR are similarly changed from "L" to "H" to check the outputs DRT0 and DRT1. It is assumed that if the second power voltage VDD1 is set at a level that is 50 mV lower than the first power voltage VDD, the outputs DRT0 and DRT1 are "L" and that if the second power voltage VDD1 is set at a level that is 45 mV lower than the first power voltage VDD, the outputs DRT0 and DRT1 are "H". In this case, it will be known that the offset voltages of the sense amplifier circuits are each between 50 and 45 mV.

In this way, the second power voltage VDD1 is set sequentially at levels 50, 45, 40, 35, . . . 10, 5, and 0 mV lower than the first power voltage VDD, and 5, 10, 15, . . . 35, 40, 45 and 50 mV higher than the first power voltage VDD, and each time such setting is made, the control signals SA and YSR are changed from "L" to "H" to thereby check the outputs DRT0 and DRT1. The respective offset voltages of the sense amplifier circuits are measured based on the difference between the first and second power voltages VDD and VDD1 when the outputs DRT0 and DRT1 are changed from "L" to "H".

Figure 3:
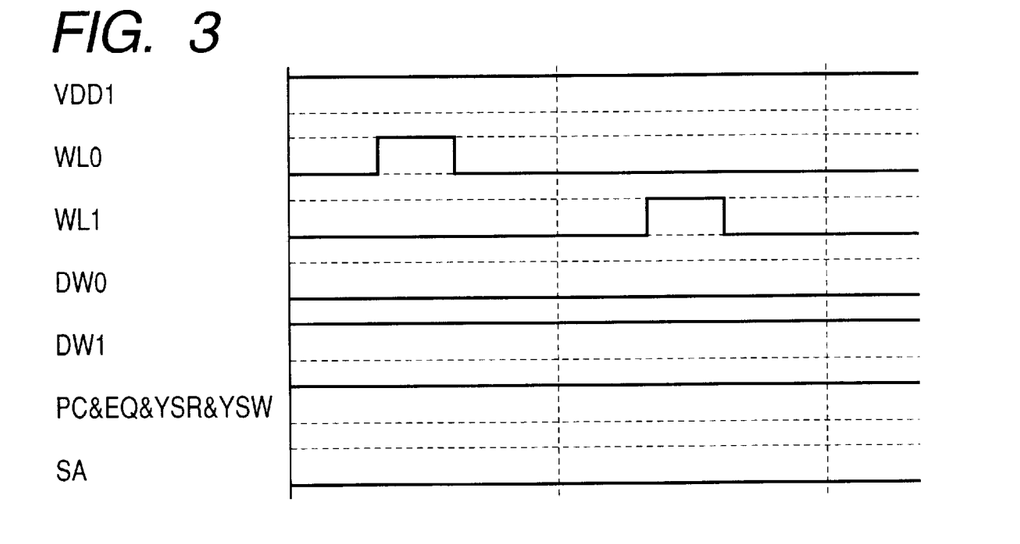
FIG. 3 illustrates a write waveform used to measure a memory cell current in the semiconductor integrated circuit according to the embodiment 1.
Figure 4:
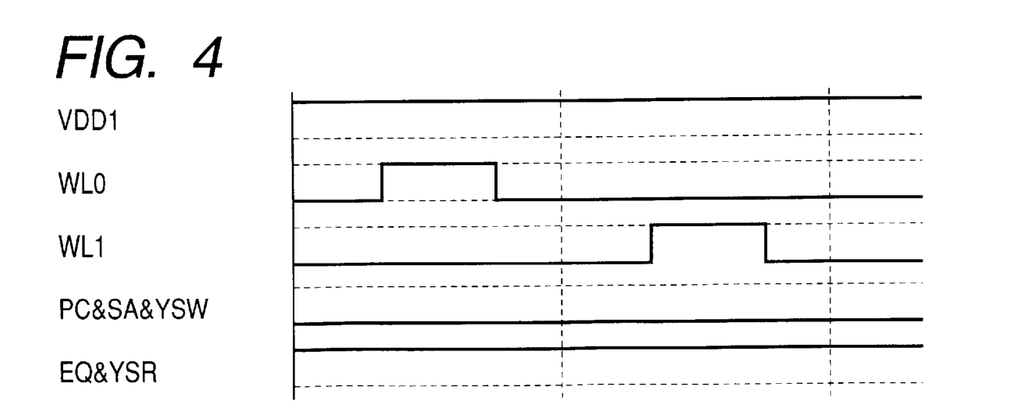
FIG. 4 illustrates an operating waveform used to measure the memory cell current in the semiconductor integrated circuit according to the embodiment 1.

A method of measuring a memory cell current will be described next with reference to FIGS. 3 and 4, which show operating waveforms of the memory cell currents when data is written to the memory cell and the current flowing through the memory cell is measured, respectively.

When data is written, the control signal SA is set at "L" and the control signals PC, EQ, YSR and YSW are set at "H" to turn on the N-channel type MOS transistors MN9, MN10, MN11 and MN12 and to turn off the P-channel type MOS transistors MP5, MP6, MP7, and MP14 and the N-channel type MOS transistors MN15 and MN18. The write signal DW0 is set at "L" and other write signals, for example DW1, to columns are set at "H". The voltage of the word line WL0 is then changed to "H". Thus, the internal nodes NL0 and NR0 of the memory cell CELL00 are set at "H" and "L", respectively. The internal nodes of all other memory cells, for example, the internal nodes NL1 and NR0 of the memory cell CELL10, connected to the word line WL0 are set at "L" and "H", respectively. That is, data inverse to that written into the cell CELL00 is written into the cell CELL10. Then, by setting the word line WL0 at "L", writing data to the first line of the memory array 111 is terminated. Similarly, data are written sequentially to all other lines of the memory array. As a result, data written into the memory cells CELL00, CELL0, . . . connected to the bit lines BL0 and BB0 are inverse to those written into the memory cells, for example, CELL10, CELL11 connected to the other bit lines, for example, BL1, BB1.

The measurement of a memory cell current will be described next. The control signals SA, PC, YSW are set at "L", and control signals EQ, YSR are set at "H" to turn on the P-channel type MOS transistors MP5, MP6, MP8 and MP9 and to turn off the P-channel type MOS transistors MP7, MP10, MP11, MP12, MP13 and MP14 and the N-channel type MOS transistors MN9, MN10, MN11, MN12, MN15 and MN18. A voltage level identical to the first power voltage VDD is supplied to the second power voltage VDD1 via a current tester (not shown).

Then, by setting the word line WL0 at "H", an electrical current flows from the second power voltage VDD1 to the N-channel type MOS transistors MN2 and MN4 of the memory cell CELL00. At this time, no electrical current flows from the second power voltage VDD1 to the memory cells other than the memory cell CELL00 connected to the word line WL0 because data has been written into the memory cells connected to the word line WL0 other than the memory cell CELL00 so that the internal nodes (for example, NR1) of the memory cells (for example, CELL10) become "H". Thus, the electrical current flowing to the second power voltage VDD1 comprises the electrical current flowing through the memory cell CELL10. Thus, the memory cell current flowing through the memory cell CELL00 can be measured. Similarly, by activating the word line WL1, a read current in the memory cell CELL01 can be measured. Similarly, by activating the other word lines sequentially, read currents in all other memory cells connected to the bit lines BL0 and BB0 can be measured.

Similarly, by writing beforehand into the memory cells connected to the bit lines BL1 and BB1 data inverse to that written to the other memory cells, the read currents in the memory cells CELL10, CELL11, connected to the bit lines BL1 and BB1 can be measured.

By repeating the above operations, all the read currents in the memory array can be measured.

Figure 5:
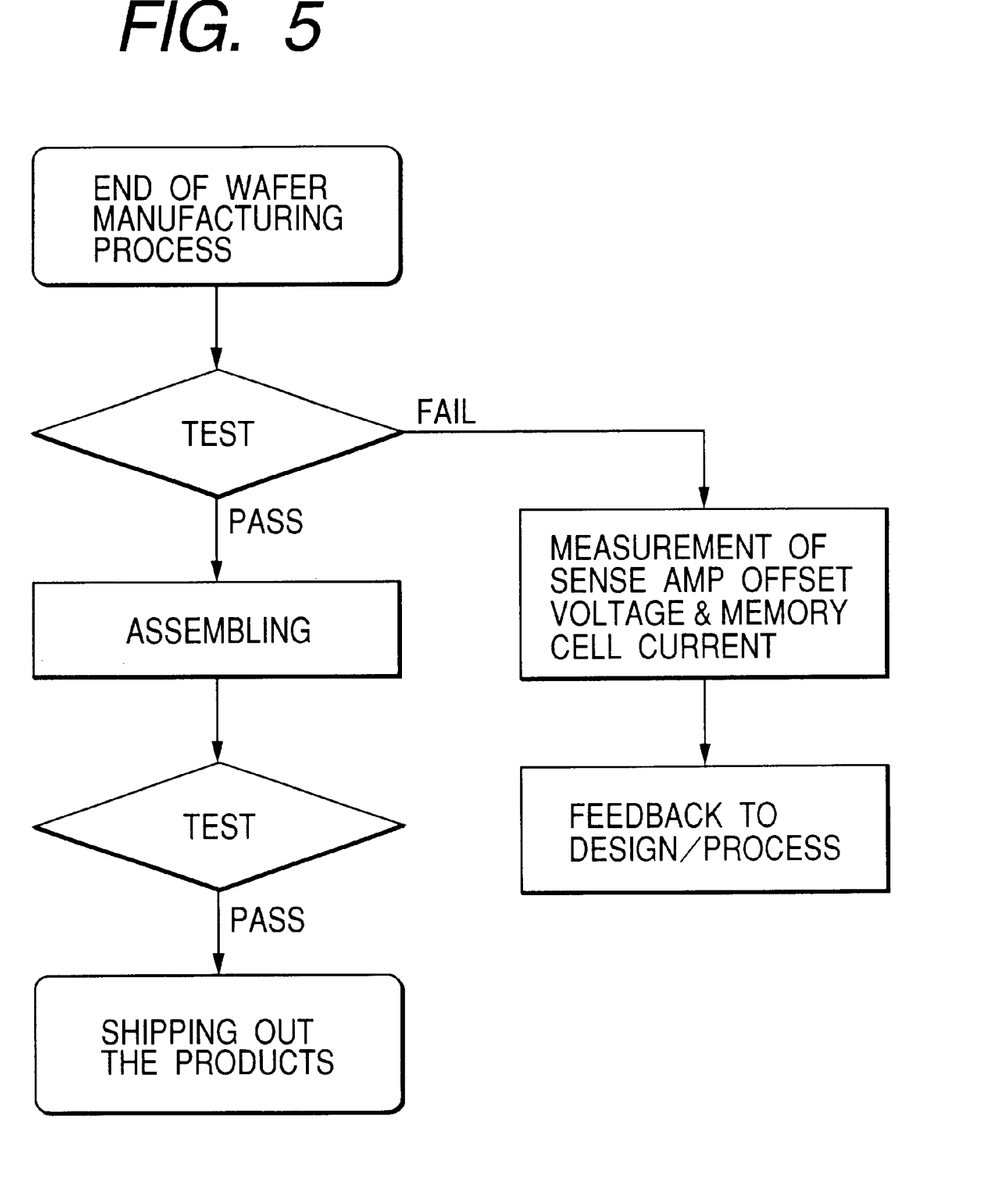
FIG. 5 is a flowchart of operation of the embodiment 1.

FIG. 5 is a flowchart of use of the present circuit in the IC manufacturing process. An integrated circuit manufactured is usually tested at its wafer level by a tester (not shown). If it passes the test, the wafer is assembled with other components into an article, which is then examined again and if it is OK, it is then shipped out. If the integrated circuit wafer fails in the test, failure analysis is then performed. The first and second power voltage lines are cut, the sense amplifier offset voltages and irregular memory cell currents are measured, and the integrated circuit is then fed back to the design and processing sections.

As described above, the memory cell currents and the sense amplifier offset voltages can be measured, using the precharge circuits and the equalizers without the necessity for adding any special switch circuits and column selecting circuits.

(Embodiment 2)

Figure 6:
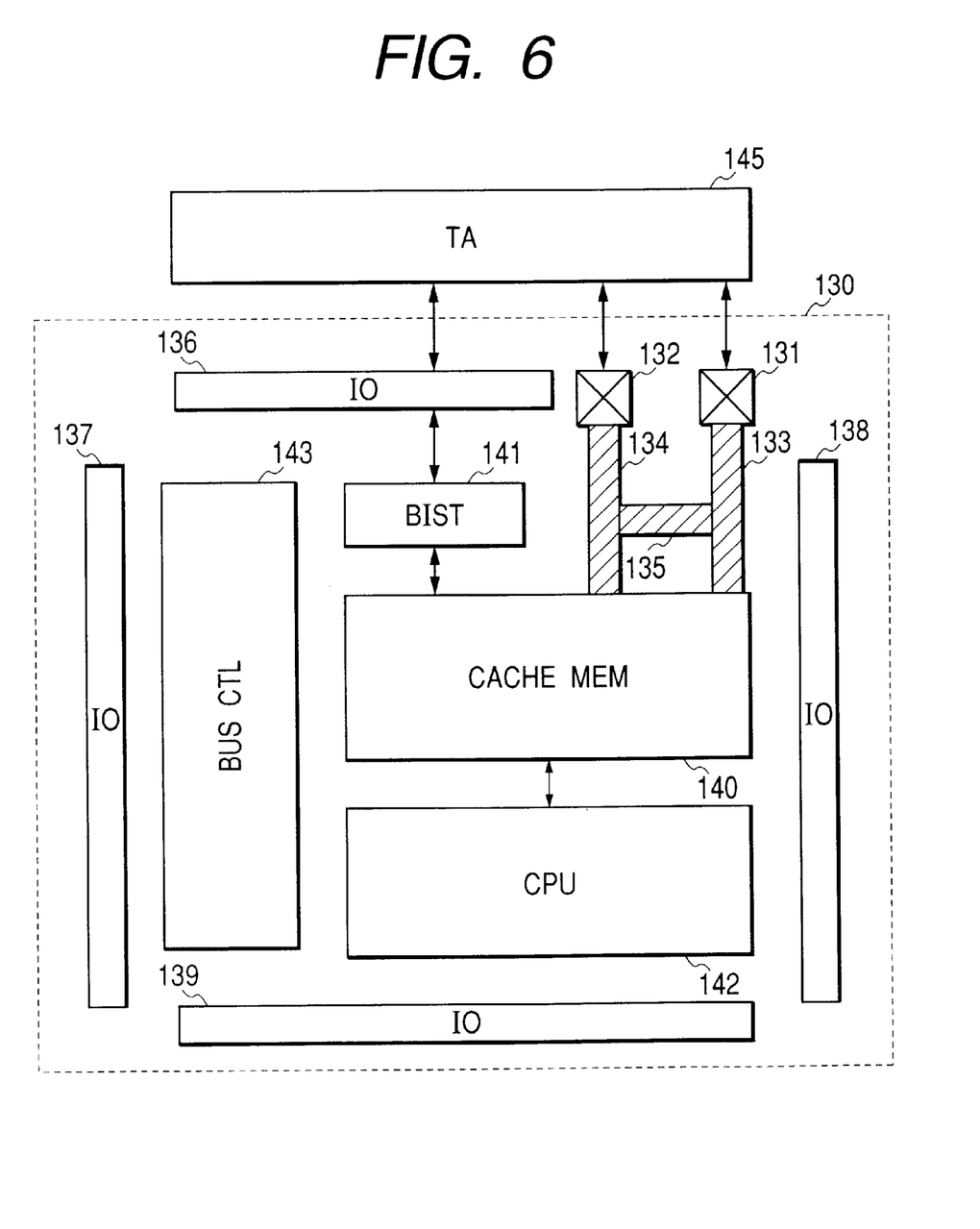
FIG. 6 is a schematic of a processor according to an embodiment 2.

FIG. 6 is a circuit diagram of one embodiment of a processor 130 that incorporates therein the semiconductor device of the embodiment 1. The cache memory 140 comprises an on-chip memory which has the same circuit as that of the embodiment 1. A first power voltage VDD identical to that of the embodiment 1 is connected to an IO pad 132 by a piece of a line 134 provided by the top metal layer. A second power voltage VDD1 identical to the second power voltage VDD1 of the embodiment 1 is connected to an IO pad 131 by a piece of line 133 provided by the top metal layer. The pieces of line 134 and 133 are connected by a piece of line 135 provided by the top metal layer.

A BIST (Built In Self Test) circuit 141 comprises a test pattern generator and an output pattern compressor (neither of which is shown) to send/receive data to/from the tester 145 through an IO circuit 136 to test a cache memory 140. The processor 130 comprises a CPU 142, a bus control circuit 143 and IO circuits 137, 138 and 139.

In the failure analysis, the line 135 is cut by a FIB (Focused Ion Beam). The first power voltage VDD is fed by the tester 145 to the IO pad 132 whereas the second power voltage VDD1 is fed to the IO pad 131. When offset voltages of the sense amplifier circuits are measured, the control described in the embodiment 1 is performed by the BITS circuit 141. Control of the second power voltage VDD is performed by a signal fed from the BIST circuit 141 to the tester 145. The measured offset voltages are fed by the BIST circuit 141 to the tester 145.

When a memory cell current is measured, the control described with reference to the embodiment 1 is performed by the BIST circuit 141 and the current is measured by a current tester built in the tester 145.

(Embodiment 3)

Figure 7:
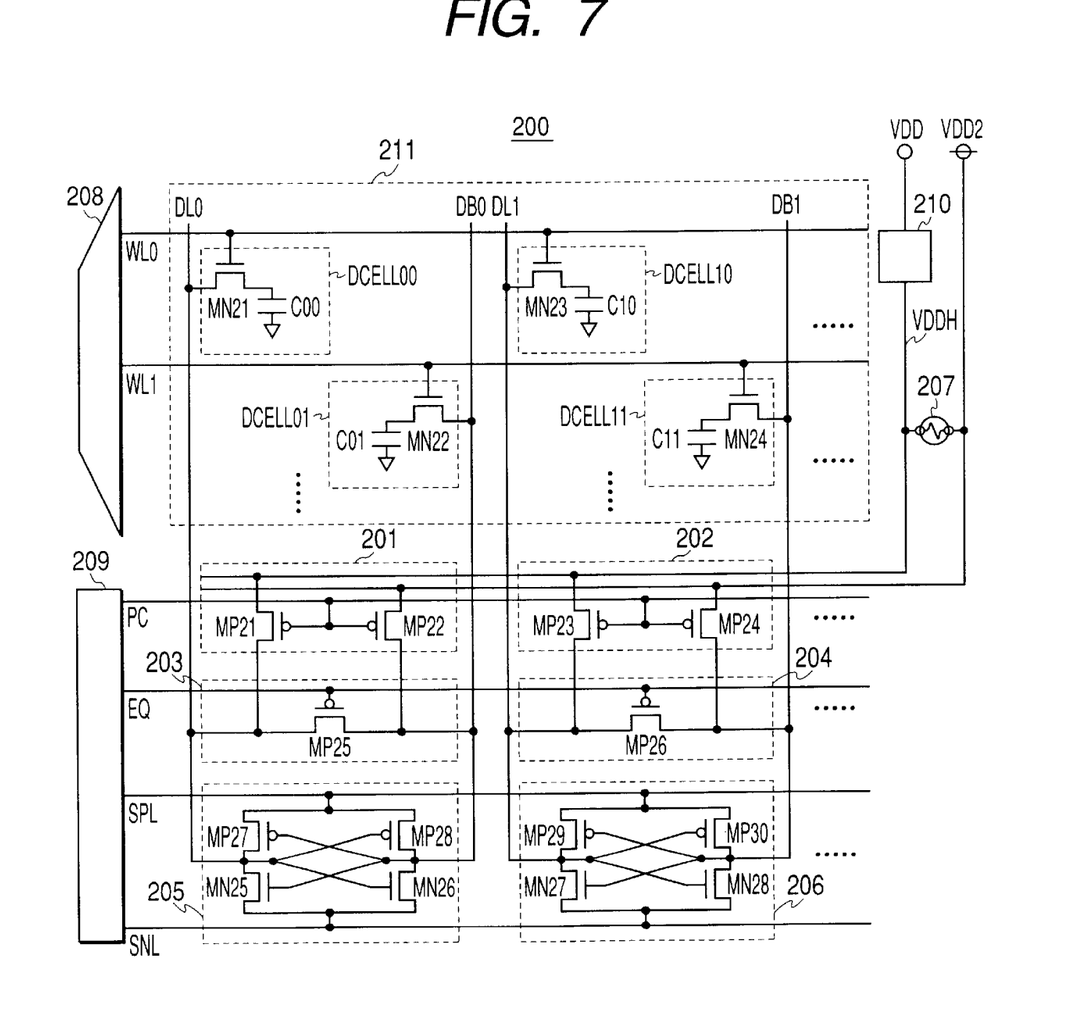
FIG. 7 is a schematic of a DRAM according to an embodiment 3.

FIG. 7 is a circuit diagram of a DRAM to which the present invention is applied. The DRAM 200 as the semiconductor device is formed on a semiconductor substrate, for example, of single crystal silicon, using semiconductor integrated circuit manufacturing techniques. A plurality of DRAM memory cells DCELL00, DCELL01, DCELL10, DCELL11, . . . are disposed in the form of a matrix on the substrate to compose a memory array 211.

For convenience of explanation, only the two detailedly illustrated columns of the memory array 211 will be described below.

The memory cell DCELL00 is composed of a capacitor C00 that stores electric charges and an N-channel type MOS transistor MN21 that transmits the information on the capacitor C00 to the bit line DL0. The gate electrode of the N-channel type MOS transistor MN21 is connected to a word line WL0.

The memory cell DCELL01 is composed of a capacitor C01 that stores electric charges and an N-channel type MOS transistor MN22 that transmits the information on the capacitor C01 to the bit line DBO. The gate electrode of the N-channel type MOS transistor MN22 is connected to a word line WL1.

The memory cell DCELL10 is composed of a capacitor C10 that stores electric charges and an N-channel type MOS transistor MN23 that transmits the information on the capacitor C10 to the bit line DL1. The gate electrode of the N-channel type MOS transistor MN23 is connected to the word line WL0.

The memory cell DCELL11 is composed of a capacitor C11 that stores electric charges and an N-channel type MOS transistor MN24 that transmits the information on the capacitor C11 to the bit line DB1. The gate electrode of the N-channel type MOS transistor MN24 is connected to the word line WL1.

Sense amplifier circuits 205 and 206; precharge circuits 201, 202; and equalizer circuits 203 and 204 are arranged in two columns.

The sense amplifier circuits 205 comprises a flip-flop of a pair of P-channel type MOS transistors MP27 and MP28 and a pair of N-channel type MOS transistors MP5 and MP26. The drain electrodes of the P- and N-channel type MOS transistors MP27 and MN25 are connected to a bit line DL0. The drain electrodes of the P- and N-channel type MOS transistors MP28 and MN26 are connected to a bit line DB0. The source electrodes of the pair of P-channel type MOS transistors MP27 and MP28 are connected to a control signal SPL whereas the source electrodes of the pair of N-channel type MOS transistors MN25 and MN26 are connected to a control signal SNL.

The sense amplifier circuits 206 comprises a flip-flop of a pair of P-channel type MOS transistors MP29 and MP30 and a pair of N-channel type MOS transistors MP27 and MP28. The drain electrodes of the P- and N-channel type MOS transistors MP29 and MN27 are connected to a bit line DL1. The drain electrodes of the P- and N-channel type MOS transistors MP30 and MN28 are connected to a bit line DB1. The source electrodes of the pair of P-channel type MOS transistors MP29 and MP30 are connected to a control signal SPL whereas the source electrodes of the pair of N-channel type MOS transistors MN27 and MN28 are connected to a control signal SNL.

The precharge circuit 201 comprises a P-channel type MOS transistor MP21 that connects the bit line DLO to a voltage VDDH that is half the first power voltage VDD, and a P-channel type MOS transistors MP22 that connects the bit line DB0 to the second power voltage VDD2. A control signal PC is applied to the gate electrodes of the P-channel type MOS transistors MP21 and MP22.

The precharge circuit 202 comprises a P-channel type MOS transistor MP23 that connects the bit line DL1 to the voltage VDDH that is half the first power voltage VDD, and a P-channel type MOS transistors MP24 that connects the bit line DB1 to the second power voltage VDD2. A control signal PC is applied to the gate electrodes of the P-channel type MOS transistors MP23 and MP24.

The equalizer 203 comprises a P-channel type MOS transistor MP25 that connects the bit line DL0 and DB0 to each other with a control signal EQ being applied to the-gate electrode of the P-channel type MOS transistor MP25.

The equalizer 204 comprises a P-channel type MOS transistor MP26 that connects the bit line DL1 and DB1 to each other with a control signal EQ being applied to the gate electrode of the P-channel type MOS transistor MP26.

The DRAM 200 also comprises a control circuit 209 that controls control signals SPL, SNL, EQ and PC, and a word driver/decoder circuit 208 that decodes the word lines WL0 and WL1.

The second power voltage VDD2 derives directly from a dedicated IO pad and is connected ordinarily to the voltage VDDH that is half the first power voltage VDD by a top metal layer, a fuse 207, a PMOS switch or a bonding wire of the package. A capacitor (not shown) having a large capacity is connected between the second power voltage VDD2 and the voltage VDDH that is half the first power voltage VDD.

The voltage VDDH that is half the first power voltage VDD is obtained from the first power voltage VDD through a voltage down converter 210.

When a new process is used or the on-chip memory becomes defective due to extension of a variety of products, the second power voltage VDD2 is separated from the voltage VDDH that is half the first power voltage. When the top metal layer connects the power voltages VDD2 and VDDH, it should be re-shaped, using a different mask or it should be cut by the FIB to separate the second power voltage VDD2 from the voltage VDDH. If the voltages VDD2 and VDDH are connected by a fuse, they should be separated from each other by cutting the fuse. When they are connected by a P-channel type MOS transistor, they are separated from each other by connecting its gate electrode to the first power voltage VDD. When they are connected within the package, and the integrated circuit is measured at its wafer level, there is no problem because they are already separated.

Figure 8:
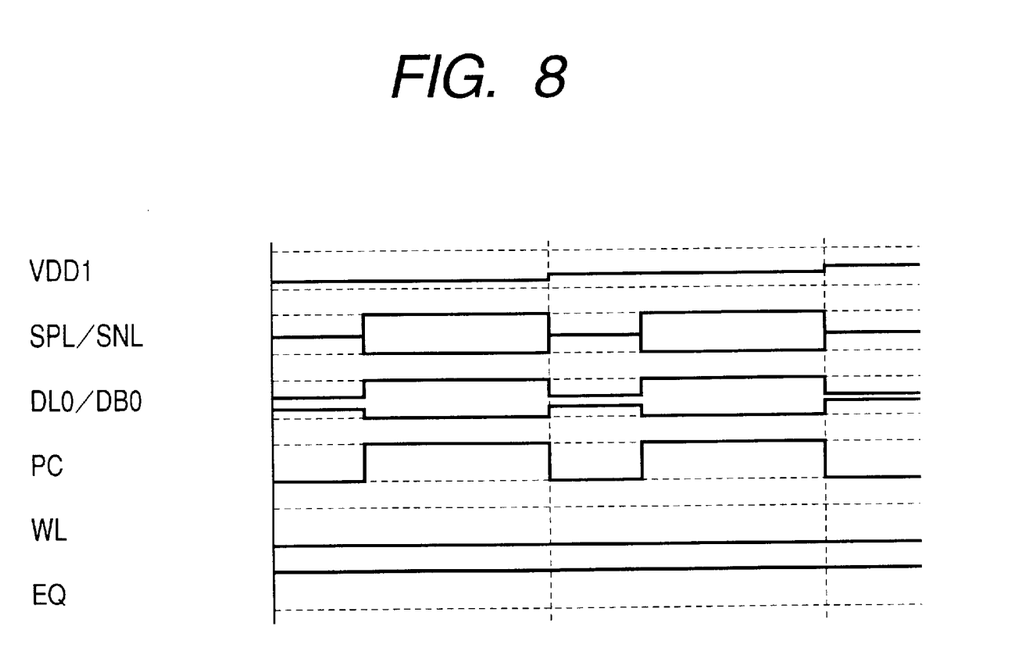
FIG. 8 illustrates an operating waveform of the DRAM according to the embodiment 2.

Measurement of offset voltages of the pair of sense amplifiers 205 and 206 of the DRAM will be described next. FIG. 8 illustrates the operating waveform of each of the sense amplifier circuits. All the word lines WL are set at "L" and rendered non-selected. A control signal EQ is set at "H" to turn off the P-channel type MOS transistors MP25 and MP26. A control signal PC is set at "L" to turn on the P-channel type MOS transistors MP21, MP22, MP23 and MP24.

Sense amplifier activation signals SPL and SNL are set at half the first power voltage VDD, and a voltage that is, for example, 50 mV lower than the voltage VDDH that is half the first power voltage VDD is fed to the second power voltage VDD2. At this time, a voltage of 50 mV is applied across the input nodes DL0 and DB0 of the sense amplifier 205, and also across the input nodes DL1 and DB1 of the sense amplifier 206.

Then, the control signals PC, SNL and SPL are simultaneously changed to "H", "L" and "H", respectively, to activate the sense amplifier circuit circuits 205 and 206 to thereby check the outputs DA0 and DL1. If the sense amplifiers have no offset voltages, it will be seen that they perform proper amplification and that the outputs DL0 and DL1 become "H". If the offset voltages of the sense amplifier circuits are not less than 50 mV, the outputs become "L".

Then, the second power voltage VDD2 is set at a level which is, for example 45 mV, lower than a voltage VDDH that is half the first power voltage VDD and the control signals PC, SNL and SPL are changed to "H", "L" and "H", respectively, to check the outputs DL0 and DL1. It is assumed that if the second power voltage VDD2 is set at a level that is 50 mV lower than the voltage VDDH, the outputs DL0 and DL1 are "H" and that if the second power voltage VDD2 is set at a level that is 45 mV lower than the voltage VDDH, the outputs DL0 and DL1 are "L". In this case, it will be known that the offset voltages of the sense amplifier circuits are each between 50 and 45 mV.

In this way, the second power voltage VDD2 is set sequentially at levels 50, 45, 40, 35, . . . 10, 5 and 0 mV lower than the voltage CDDH that is half the first power voltage VDD, and 5, 10, 15, . . . 35, 40, 45 and 50 mV higher than the first power voltage VDD, and each time such setting is made, the control signals PC, SNL and SPL are changed to "H", "L" and "H", respectively, to thereby check the outputs DL0 and DL1. The respective offset voltages of the sense amplifier circuits are measured based on the difference between the voltages VDDH and VDD2 when the outputs DL0 and DL1 are changed from "H" to "L".

According to the above-mentioned embodiments of the present invention, failure analysis can be made easily and the manufactured articles can be early started up without increasing the cost.

What is claimed is:

1. A semiconductor integrated circuit comprising:
    a plurality of memory cells;
    a pair of bit line and complementary bit line connected to said plurality of memory cells;
    a first connection circuit for connecting said bit line to a first power voltage line;
    a second connection circuit for connecting said complementary bit line to a second power voltage line;
    a sense amplifier circuit; and
    a third connection circuit for connecting said bit line and said complementary bit line,
    wherein said first, second and third connection circuit are placed between said plurality of memory cells and said sense amplifier circuit, and
    wherein control signals for said first and second connection circuits are separated from a control signal for said third connection circuit.

2. The semiconductor integrated circuit according to claim 1, wherein said first and second power voltage lines are supplied with different voltages in failure analysis.

3. The semiconductor integrated circuit according to claim 1, wherein said first and second connection circuits are used to precharge said bit line and said complementary bit line, and said third connection circuit is used to equalize said bit line and said complementary bit line.

4. The semiconductor integrated circuit according to claim 1, wherein a read current in each of said plurality of memory cells is measured by supplying said bit line and said complementary bit line with separate voltages in failure analysis.

5. The semiconductor integrated circuit according to claim 1, further comprising:
    a fourth connection circuit for connecting said bit line to said sense amplifier circuit; and
    a fifth connection circuit for connecting said complementary bit line to the sense amplifier circuit,
    wherein control signals for said first and second connection circuits are serparated from a control signal for said third connection circuit.

6. The semiconductor integrated circuit according to claim 5, wherein said first and second power voltage lines are supplied with different voltages, respectively, in failure analysis.

7. The semiconductor integrated circuit according to claim 5, wherein said first and second connection circuits are used to precharge said bit line and the said complementary bit line, and said third connection circuit is used to equalize said bit line and said complementary bit line.

8. The semiconductor integrated circuit according to claim 5, wherein an offset voltage of said sense amplifier is measured by supplying said bit line and said complementary bit line with separate voltages in failure analysis.

9. A semiconductor integrated circuit comprising:
    a first bit line and a second bit line;
    a plurality of memory cells connected to said first and second bit lines;
    a first MOS transistor whose source and drain electrodes are connected to said first and second bit lines;
    a second MOS transistor whose drain electrode is connected to said first bit line;
    a third MOS transistor whose drain electrode is connected to said second bit line and whose gate electrode is connected to the gate electrode of said second MOS transistor;
    a first line connected to the gate electrode of said first MOS transistor; and
    a second line connected to the gate electrode of said second MOS transistor,
    wherein said first, second and third connection circuit are placed between said plurality of memory cells and said sense amplifier circuit, and
    wherein said first line is separated from said second line.

10. A semiconductor integrated circuit comprising:
    a first bit line and a second bit line;
    a plurality of memory cells each connected to said first and second bit lines;
    a first MOS transistor whose source and drain electrodes are connected to said first and second bit lines, respectively;
    a second MOS transistor whose drain electrode is connected to said first bit line; and
    a third MOS transistor whose drain electrode is connected to said second bit line and whose gate electrode is connected to the gate electrode of said second MOS transistor,
    wherein said first, second and third connection circuit are placed between said plurality of memory cells and said sense amplifier circuit, and
    wherein a first line connected to the source electrode of said second MOS transistor is separated from a second line connected to the source electrode of said third MOS transistor.

11. The semiconductor integrated circuit according to claim 9, further comprising:
    a fuse circuit connected between the sources of said second and third MOS transistor;
    a write amplifier circuit;
    a fourth MOS transistor whose source/drain path is connected between said first bit line and said sense amplifier circuit;

a fifth MOS transistor whose source/drain path is connected between said first bit line and said sense amplifier circuit;

a sixth MOS transistor whose source/drain path is connected between said first bit line and said write amplifier circuit; and a seventh MOS transistor whose source/drain path is connected between said second bit line and said write amplifier circuit.

12. The semiconductor integrated circuit according to claim 11, wherein an offset voltage of said sense amplifier is measured by feeding different voltages to said first and second bit line and controlling the gate of said fourth and fifth MOS transistor.

13. The semiconductor integrated circuit according to claim 10, further comprising:

a fuse circuit connected between the sources of said second and third MOS transistor;

a sense amplifier circuit;

a fourth MOS transistor whose source/drain path is connected between said first bit line and said sense amplifier circuit;

a fifth MOS transistor whose source/drain path is connected between said second bit line and said sense amplifier circuit;

a sixth MOS transistor whose source/drain path is connected between said first bit line and said write amplifier circuit; and a seventh MOS transistor whose source/drain path is connected between said second bit line and said write amplifier circuit.

14. The semiconductor integrated circuit according to claim 11, further comprising:

a built-in-self-test (BIST) circuit, wherein said memory cells are SRAM memory cells, and wherein the offset voltage of said sense amplifier is measured by feeding different voltages to said first and second bit line and controlling the gate of said fourth and fifth MOS transistor.

* * * * *